United States Patent

Morita et al.

(10) Patent No.: US 7,994,246 B2
(45) Date of Patent: Aug. 9, 2011

(54) CURABLE SILICONE COMPOSITION AND ELECTRONIC COMPONENT

(75) Inventors: Yoshitsugu Morita, Ichihara (JP); Tomoko Kato, Ichihara (JP)

(73) Assignee: Dow Corning Toray Company, Ltd., Chiyoda-Ku, Tokyo (JP)

( * ) Notice: Subject to any disclaimer, the term of this patent is extended or adjusted under 35 U.S.C. 154(b) by 0 days.

(21) Appl. No.: 12/520,899

(22) PCT Filed: Dec. 14, 2007

(86) PCT No.: PCT/JP2007/074607
§ 371 (c)(1), (2), (4) Date: Nov. 3, 2009

(87) PCT Pub. No.: WO2008/078663
PCT Pub. Date: Jul. 3, 2008

(65) Prior Publication Data
US 2010/0063185 A1    Mar. 11, 2010

(30) Foreign Application Priority Data
Dec. 25, 2006   (JP) ................................ 2006-346865

(51) Int. Cl.
*C08K 5/1515* (2006.01)
*C08K 5/16* (2006.01)

(52) U.S. Cl. ........ 524/109; 524/714; 524/731; 524/751; 524/863; 524/864

(58) Field of Classification Search .................. 524/109, 524/714, 731, 751, 863, 864
See application file for complete search history.

(56) References Cited

U.S. PATENT DOCUMENTS
2007/0149727 A1*  6/2007  Okuhira et al. ............... 525/523

FOREIGN PATENT DOCUMENTS
| JP | 06056999 A | 3/1993 |
| JP | 2005154766 A | 6/2005 |
| JP | 2006306953 A | 11/2006 |
| JP | 2006306954 A | 11/2006 |
| WO | WO 2006118335 A1 | 11/2006 |

OTHER PUBLICATIONS

English language translation and abstract for JP 06-056999 extracted from PAJ database, dated Nov. 6, 2009, 71 pages.
English language translation and abstract for JP 2005-154766 extracted from PAJ database, dated Nov. 6, 2009, 55 pages.
English language translation and abstract for JP 2006-306953 extracted from PAJ database, dated Nov. 6, 2009, 55 pages.
English language translation and abstract for JP 2006-306954 extracted from PAJ database, dated Nov. 6, 2009, 78 pages.
PCT International Search Report for PCT/JP2007/074607, dated Mar. 28, 2008, 3 pages.

\* cited by examiner

*Primary Examiner* — Kriellion A Sanders
(74) *Attorney, Agent, or Firm* — Howard & Howard Attorneys PLLC

(57) ABSTRACT

A curable silicone composition comprising at least the following components: (A) an epoxy-containing organopolysiloxane; (B) a curing agent for epoxy resin; and (C) an epoxy compound represented by the specific general formula; is characterized by excellent handleability and reduced oil-bleeding, and, when cured, forms a cured body of excellent flexibility and adhesion.

15 Claims, 1 Drawing Sheet

CURABLE SILICONE COMPOSITION AND ELECTRONIC COMPONENT

RELATED APPLICATIONS

This application claims priority to and all the advantages of International Patent Application No. PCT/JP2007/074607, filed on Dec. 14, 2007, which claims priority to Japanese Patent Application No. JP2006-346865, filed on Dec. 25, 2006.

TECHNICAL FIELD

The present invention relates to a curable silicone composition and to an electronic component. More specifically, the invention relates to a curable silicone composition that is characterized by excellent handleability and reduced oil-bleeding, and that, when cured, forms a cured body of excellent flexibility and adhesion. The invention also relates to an electronic component that is sealed or bonded by means of a cured body of the aforementioned composition and is characterized by excellent reliability.

BACKGROUND ART

Cured bodies obtained by curing conventional curable resin compositions, such as curable epoxy resin compositions, etc., used for sealing and bonding parts of electrical and electronic components are characterized by high modulus of elasticity and therefore by high rigidity. Therefore, the use of such bodies in conjunction with electrical or electronic components is associated with problems such as development of high stress, which develops under conditions of thermal expansion. Another problem associated with the use of cured bodies of the aforementioned compositions is buckling of the electrical or electronic components or substrates and formation of cracks in the body of the cured resin or gaps in the interface between the cured resin and the electrical or electronic component, which in some cases may lead to destruction of the respective components.

In order to reduce stress that may develop in the aforementioned cured bodies, it was suggested to prepare a curable silicone composition from an epoxy-containing organopolysiloxane and a curing agent for organopolysiloxane resin (see Japanese Unexamined Patent Application Publications (hereinafter referred to as "Kokai")2005-154766, 2006-306953, and 2006-306954). However, when such curable silicone compositions are used for bonding parts of electrical or electronic components, the problem of oil-bleeding of some components of the composition to the outer surface of the cured bodies occurs, and this contaminates the components.

It is an object of the present invention to provide a curable silicone composition that is characterized by excellent handleability and the possibility of forming a cured body that is characterized by reduced oil-bleeding and excellent flexibility and adhesion. It is another object to provide electronic components of excellent reliability.

DISCLOSURE OF INVENTION

More specifically the present invention provides a curable silicone composition comprising at least the following components:

(A) (A$_1$) an organopolysiloxane that contains in one molecule at least two epoxy-containing univalent organic groups and is represented by the following average unit formula:

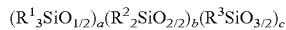

$(R^1{}_3SiO_{1/2})_a(R^2{}_2SiO_{2/2})_b(R^3SiO_{3/2})_c$ (where $R^1$, $R^2$, and $R^3$ may be the same or different and designate substituted or unsubstituted monovalent hydrocarbon groups or epoxy-containing monovalent hydrocarbon groups; however, at least 20 mole % of the groups designated by $R^3$ are aryl groups; and where "a", "b", and "c" are numbers that satisfy the following conditions: $0 \leq a \leq 0.8$; $0 \leq b \leq 0.8$; $0.2 \leq c \leq 0.9$; a+b+c=1) and/or (A$_2$) a diorganopolysiloxane of the following general formula:

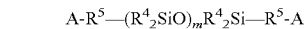

$A-R^5-(R^4{}_2SiO)_mR^4{}_2Si-R^5-A$

{where $R^4$ is a substituted or unsubstituted monovalent hydrocarbon group which is free of unsaturated aliphatic bonds; $R^5$ is bivalent organic group; and "A" is a siloxane residual radical represented by the following average unit formula:

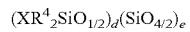

$(XR^4{}_2SiO_{1/2})_d(SiO_{4/2})_e$ (where $R^4$ is the same as defined above, and "X" is a single bond, a hydrogen atom, a group designated by $R^4$, an epoxy-containing monovalent organic group, or an alkoxysilylalkyl group; however, at least one group designated by "X" in one molecule is a single bond, at least two groups designated by "X" are epoxy-containing monovalent organic groups; "d" is a positive number; "e" is a positive number; and "d/e" is a number ranging from 0.2 to 4), and where "m" is an integer equal to or greater than 1};

(B) a curing agent for epoxy resin; and (C) an epoxy compound represented by the following general formula:

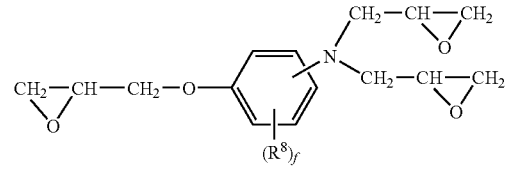

(where $R^8$ is a substituted or unsubstituted monovalent hydrocarbon group having 1 to 10 carbon atoms; and "f" is an integer from 0 to 4.)

Furthermore, an electronic component according to the present invention is one that is sealed or bonded by using the aforementioned curable silicone composition.

EFFECTS OF INVENTION

The curable silicone composition of the present invention is efficient in that it is characterized by excellent handleability and is less subject to contamination of the surface of the cured body because oil bleeding is reduced. Furthermore, the cured body of the composition can be bonded to various substrates, possesses excellent flexibility and adhesion, and develops reduced internal stress under the effect of thermal expansion. Furthermore, because electronic components that are made in accordance with the present invention are sealed or bonded with the use of cured bodies of the above-described curable silicone composition, these components are characterized by excellent reliability.

REFERENCE NUMERALS

Figure 1:
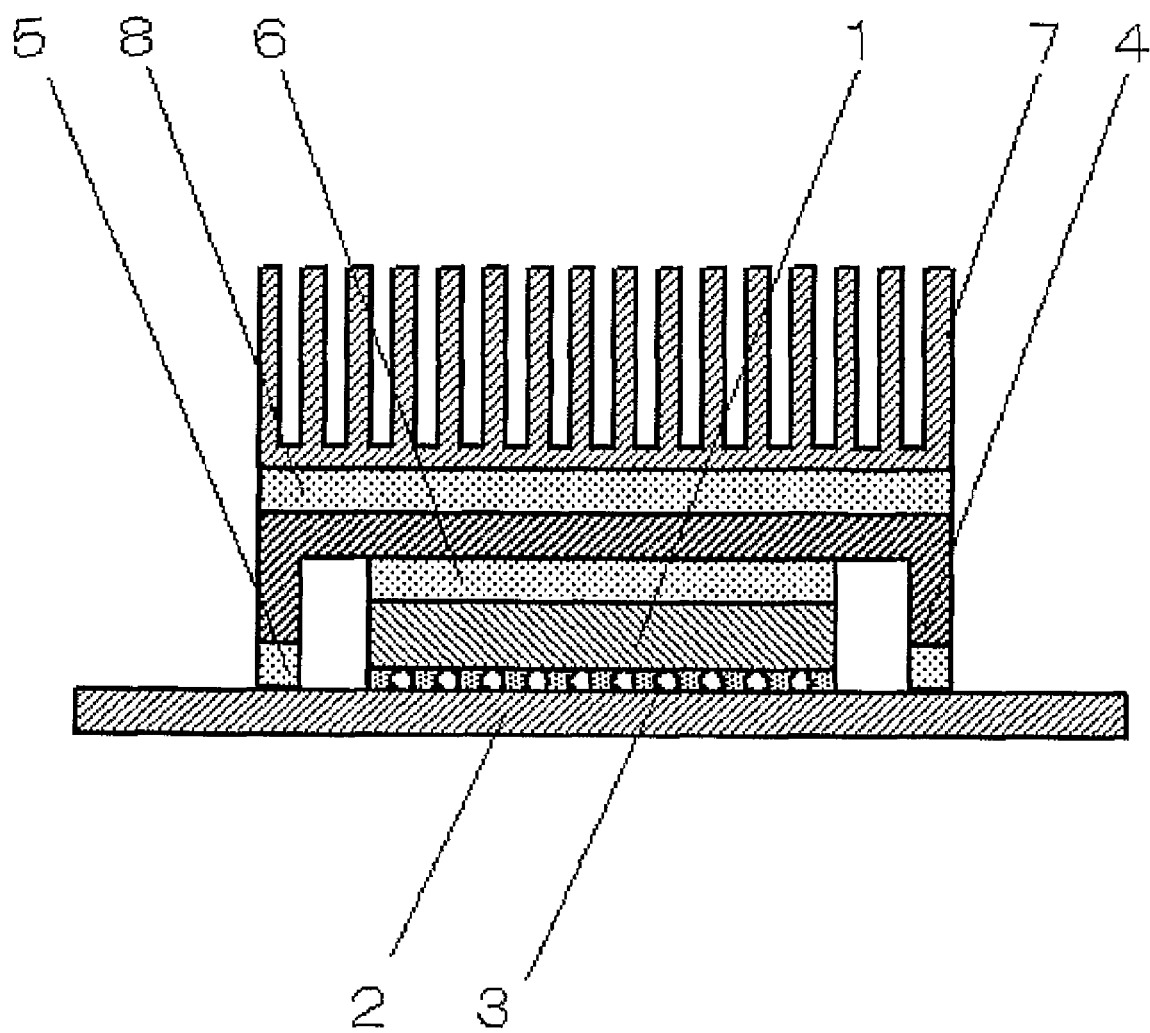
FIG. 1 is a cross-sectional view of an LSI as an example of the electronic component of the invention.

1 Semiconductor element
2 Substrate
3 Ball grid

4 Heat spreader
5 Bonding elements
6 Heat-radiating element
7 Heat sink
8 Heat-radiating element

DETAILED DESCRIPTION OF THE INVENTION

Let us first consider in more detail a curable silicone composition of the present invention.

Component (A) of the composition is a main component of the composition. This component is ($A_1$) an organopolysiloxane represented by the following average unit formula:

$$(R^1{}_3SiO_{1/2})_a(R^2{}_2SiO_{2/2})_b(R^3SiO_{3/2})_c$$

and/or ($A_2$) a diorganosiloxane represented by the following general formula:

$$A\text{-}R^5\text{---}(R^4{}_2SiO)_m R^4{}_2Si\text{---}R^5\text{-}A.$$

In component ($A_1$), $R^1$, $R^2$, and $R^3$ may be the same or different and constitute substituted or unsubstituted monovalent hydrocarbon groups or epoxy-containing monovalent organic groups. The aforementioned monovalent hydrocarbon groups can be represented by methyl, ethyl, propyl, isopropyl, n-butyl, sec-butyl, t-butyl, pentyl, hexyl, or similar alkyl groups; cyclopentyl, cyclohexyl, cycloheptyl, or similar cycloalkyl groups; vinyl, allyl, butenyl, pentenyl, hexenyl, or similar alkenyl groups; phenyl, tolyl, xylyl, or similar aryl groups; benzyl, phenethyl, phenylpropyl, or similar aralkyl groups; chloromethyl, 3-chloropropyl, 3,3,3-trifluoropropyl, or similar halogenated alkyl groups. Most preferable are alkyl and aryl groups, especially methyl and phenyl groups. Epoxy-containing monovalent organic groups can be represented by 2-glycidoxyethyl, 3-glycidoxypropyl, 4-glycidoxybutyl, or similar glycidoxyalkyl groups; or 2-(3,4-epoxycyclohexyl)ethyl, 3-(3,4-epoxycyclohexyl)propyl, 2-(3,4-epoxy-3-methylcyclohexyl)-2-methylethyl, or similar epoxycycloalkylalkyl groups; and 4-oxiranylbutyl, 8-oxiranyloctyl, or similar oxiranylalkyl groups. Most preferable of these groups are glycidoxyalkyl and epoxycycloalkylalkyl, especially 3-glycidoxypropyl and 2-(3,4-epoxycyclohexyl)ethyl groups. In the above formula, at least two groups designated by, $R^1$, $R^2$, and $R^3$ are the aforementioned epoxy-containing monovalent organic groups.

In the above formula, at least 20 mole %, preferably at least 50 mole %, and most preferably at least 80 mole % of all groups designated by $R^3$ are aryl groups. If the content of the aryl groups among all groups designed by $R^3$ in one molecule is below the recommended lower limit, this will either impair adhesive properties or will reduce the mechanical strength of the cured body of the composition. It is recommended that such aryl groups comprise phenyl groups.

In the above formula, "a", "b", and "c" are numbers that satisfy the following conditions: $0 \leq a \leq 0.8$; $0 \leq b \leq 0.8$; $0.2 \leq c \leq 0.9$; $a+b+c=1$ Here, "a" is a number that shows the percentage of siloxane units represented by formula: $R^{13}SiO_{1/2}$. When this component is composed of only siloxane units represented by formula: $R^3SiO_{3/2}$, the present component will become too viscous, and because this will impair handleability of the obtained composition, it is recommended that "a" be a number that satisfies the following condition: $0 < a \leq 0.8$, and preferably the following condition: $0.3 \leq a \leq 0.8$. Furthermore, "b" is a number that shows the percentage of siloxane units represented by formula: $R^2{}_2SiO_{2/2}$. In order to provide this component with optimal molecular weight, to prevent this composition from bleeding out from the obtained cured body and to provide the cured body with excellent mechanical strength, "b" should be a number that satisfies the following condition: $0 \leq b \leq 0.6$. In the above formula, "c" shows the percentage of siloxane units represented by formula: $R^3SiO_{3/2}$. In order to provide good handleability of the composition and to provide a cured body with good adhesion, good mechanical properties, and flexibility, "c" should be a number that satisfies the following condition: $0.4 \leq c \leq 0.9$.

There are no special restrictions with regard to the content of epoxy-containing monovalent organic groups in component ($A_1$); however, it may be recommended to use these groups in the epoxy-equivalent quantity of this component (i.e., number obtained by dividing mass average molecular weight of this component by the number of epoxy groups in one molecule) should be in the range of 100 to 2,000, preferably 100 to 1,000, and most preferably 100 to 700. If the epoxy-equivalent quantity is less than the recommended lower limit of the above range, this will impair flexibility of a cured body obtained from the composition. On the other hand, if the epoxy-equivalent is greater than the recommended upper limit, this will impair curability of the composition and will reduce adhesion and mechanical strength of the cured body obtained by curing the composition. Furthermore, component ($A_1$) may comprise an organopolysiloxane of one type or a mixture of organopolysiloxanes of two or more types. There are no special restrictions with regard to the form of component ($A_1$) at 25° C., and it can be liquid or solid. When component ($A_1$) is in a solid form, in order to uniformly mix it with other components, component ($A_1$) may be dissolved in an organic solvent or heated. Use of this component in a liquid form at 25° C. is preferable from the viewpoint of better compoundability and handleability. Also, there are no special restrictions with regard to the mass-average molecular weight of component ($A_1$), but it may be recommended that this characteristic range from 500 to 10,000, preferably from 750 to 3,000.

The aforementioned component ($A_1$) can be exemplified by organopolysiloxanes that are represented by the formulas given below, where "a", "b", and "c" are the same as defined above but where "a" and "b" cannot be equal to zero; "c'" and "c''" are numbers that satisfy the following conditions: $0.1 < c' < 0.8$; $0 < c'' < 0.2$; $0.2 \leq (c'+c'') \leq 0.9$; and $0.2 \leq c'/(c'+c'')$; "G" designates a 3-glycidoxypropyl group; and "E" designates a 2-(3,4-epoxycyclohexyl)ethyl group.

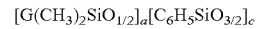

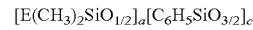

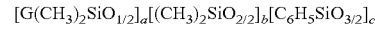

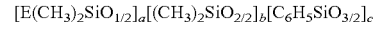

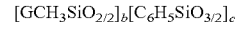

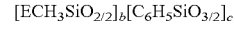

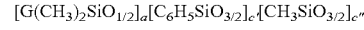

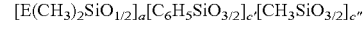

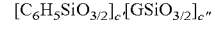

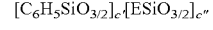

There are no special restrictions with regard to the method of preparation of component ($A_1$). For example, the following methods are possible: (1) a method, in which a phenyltrialkoxysilane and an alkoxysilane with epoxy-containing monovalent organic groups, e.g., 3-glyeidoxypropyltrimethoxysilane or 2-(3,4-epoxycyclohexyl)ethyltrimethoxysilane are subjected to co-hydrolyzation and condensation; (2) a method, in which an alkoxysilane having the aforementioned epoxy-containing monovalent organic groups and silanol-containing organopolysiloxane obtained by subjecting a phenyltrichlorosilane or a phenyltrialkoxysilane to hydrolyzation and condensation are subjected to a dealcoholization reaction; (3) a method, in which a hydrosilylation reaction is carried out between an olefin that has epoxy-containing monovalent organic groups and an organopolysiloxane having silicon-bonded hydrogen atoms prepared by subjecting a phenyltrichlorosilane or a phenyltrialkoxysilane to co-hydrolysis and condensation in the presence of a dimethylchlorosilane or a similar silane having a silicon-bonded hydrogen atom; (4) a method, in which a copolymer of a dimethylsiloxane and a methyl {2-(3,4-epoxychlorohexyl)ethyl} siloxane capped at both molecular terminals with trimethylsiloxy groups or a copolymer of a dimethylsiloxane and a methyl (3-glycidoxypropyl)siloxane capped at both molecular terminals with trimethylsiloxy groups and an organopolysiloxane prepared by subjecting a phenyltrichlorosilane or a phenyltrialkoxysilane to hydrolysis and condensation are subjected to an equilibrium reaction in the presence of a basic catalyst; (5) a method, in which a cyclic methyl {2-(3,4-epoxycyclohexyl)ethyl} siloxane or a cyclic methyl (3-glycidoxypropyl) siloxane and an organopolysiloxane composed of siloxane units of the following formula: $C_6H_5SiO_{3/2}$ are subjected to an equilibrium reaction in the presence of a basic catalyst; and (6) a method, in which a cyclic dimethylsiloxane and a cyclic {2-(3,4-epoxycyclohexyl)ethyl} siloxane or a cyclic methyl (3-glycidoxypropyl) siloxane and an organopolysiloxane composed of siloxane units of the following formula: $C_6H_5SiO_{3/2}$ are subjected to an equilibrium reaction in the presence of an acidic or a basic catalyst.

In component ($A_2$), the groups designated by $R^4$ may be substituted or unsubstituted monovalent hydrocarbon groups, which are free of unsaturated aliphatic groups. Specific examples of groups designated by $R^4$ are the following: methyl, ethyl, propyl, isopropyl, n-butyl, sec-butyl, t-butyl, pentyl, hexyl, or similar alkyl groups; cyclopentyl, cyclohexyl, cycloheptyl, or similar cycloalkyl groups; phenyl, tolyl, xylyl, or similar aryl groups; benzyl, phenethyl, phenylpropyl, or similar aralkyl groups; 3-chloropropyl, 3,3,3-trifluoropropyl, or similar halogenated alkyl groups. Most preferable are alkyl groups, especially methyl groups. In the above formula, $R^5$ is a bivalent organic group, such as ethylene, methylethylene, propylene, butylene, pentylene, hexylene, or a similar alkylene group; ethyleneoxyethylene, ethyleneoxypropylene, ethyleneoxybutylene, propyleneoxypropylene, or a similar alkyleneoxyalkylene group. Preferable are alkylene groups, in particular, ethylene groups. In the formula, "m" is an integer, which is equal to or greater than 1 and which represents a degree of polymerization of the diorganopolysiloxane contained in the main molecular chain. From the viewpoint of improved flexibility of a cured body of the composition, "m" should be equal to or greater than 10. There are no special restrictions with regard to the upper limit of the value of "m", but it is recommended that the value of "m" do not exceed 500.

Furthermore, in the above formula, "A" designates a siloxane-residual radical represented by the following average unit formula:

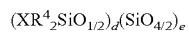

where $R^4$ stands for a substituted or unsubstituted monovalent hydrocarbon group that is free of unsaturated aliphatic bonds. This group may be the same as exemplified above, of which alkyl groups, and especially methyl groups, are preferable. In the above formula, "X" is a single bond, a hydrogen atom, a group designated by $R^4$, an epoxy-containing monovalent organic group, or an alkoxysilylalkyl group. Groups designated by $R^4$ may be exemplified by the same groups as given above. The aforementioned epoxy-containing monovalent organic groups may be the same as those designated by $R^1$, $R^2$, or $R^3$. The alkoxysilylalkyl group can be exemplified by a trimethoxysilylethyl, trimethoxysilylpropyl, dimethoxymethylsilylpropyl, methoxydimethylsilylpropyl, triethoxysilylethyl, or a tripropoxysilylpropyl group. However, at least one group designated by "X" in one molecule is a single bond, which is used for bonding to the group designated by $R^5$ in the aforementioned diorganosiloxane. Furthermore, at least one group in one molecule designated by "X" should comprise an epoxy-containing monovalent organic group, preferably such as a glycidoxyalkyl group, and most preferably a 3-glycidoxypropyl group. In the above formula "d" is a positive number, "e" is a positive number, and "d/e" is a number ranging from 0.2 to 4.

There are no special restrictions with regard to molecular weight of component ($A_2$); however, it is recommended that mass average molecular weight be in the range of 500 to 1,000,000. Also, there are no special restrictions with regard to the form of component ($A_2$) at 25° C., but the liquid form is preferable. It is recommended that component ($A_2$) have a viscosity at 25° C. in the range of 50 to 1,000,000 mPa·s. The method of preparation of component ($A_2$) is described, e.g., in Kokai H06-56999.

In the composition of the present invention, component (A) may comprise either aforementioned component ($A_1$) or component ($A_2$), or a mixture of both. There are no special restrictions with regard to the amount in which component ($A_2$) can be used when component (A) is represented by a mixture of components ($A_1$) and ($A_2$), but it may be recommended that component ($A_2$) be contained in the amount of 0.1 to 800 parts by mass, preferably 1 to 500 parts by mass, and, most preferably, 10 to 200 parts by mass per 100 parts by mass of component ($A_1$). If component ($A_2$) is added in an amount less than the recommended lower limit, this will impair flexibility of a cured body produced by curing the composition, and if, on the other hand, the content of component ($A_2$) exceeds the recommended upper limit, the obtained composition will have increased viscosity.

Component (B), which is a curing agent for epoxy resin, reacts with epoxy groups of component (A) and is used as an agent for curing the composition. It is recommended that this agent be a component that contains in one molecule two or more functional groups that react with epoxy groups. The aforementioned functional groups may be exemplified by primary amine groups, secondary amine groups, hydroxyl groups, phenolic hydroxyl groups, carboxylic acid groups, acid anhydride groups, mercapto groups, or silanol groups. The use of phenolic hydroxyl groups is preferred from the viewpoint of better reactivity and pot life. In particular, it is recommended that component (B) comprise a compound that contains phenolic hydroxyl groups such as phenol novolak resin, cresol novolak resin, bisphenol A-type compound, or a similar phenol-type resin; and organosiloxane having phenolic hydroxyl groups. It is preferable to use an organosiloxane that contains in one molecule at least two phenolic hydroxyl groups. It is recommended that the equivalent amount of phenolic hydroxyl groups, which is a value obtained by dividing the mass average molecular weight of the present component by the number of phenolic hydroxyl groups contained in one molecule, does not exceed 1,000 and for better reactivity, does not exceed 500.

Since provision of organosiloxane with phenolic hydroxyl groups in component (B) improves flexibility of a cured body obtained by curing the composition, it is recommended that the organosiloxane be represented by the following general formula:

$R^6_3SiO(R^6_2SiO)_nSiR^6_3$

In the above formula, the groups that are designated by $R^6$ may be the same or different and represent substituted or unsubstituted monovalent hydrocarbon groups or monovalent organic groups that contain phenolic hydroxyl groups. The aforementioned monovalent hydrocarbon groups may be the same as those exemplified above, of which alkyl groups and aryl groups, especially methyl groups and phenyl groups, are preferable. Organic groups that contain phenolic groups may be exemplified by the groups shown by the formulae given below. In these formulae, $R^7$ designates bivalent organic groups such as ethylene, methylethylene, propylene, butylene, pentylene, hexylene, or similar alkylene groups; ethyleneoxyethylene, ethyleneoxypropylene, ethyleneoxybutylene, propyleneoxypropylene, or similar alkyleneoxyalkylene groups. Preferable are alkylene groups and, in particular, propylene groups.

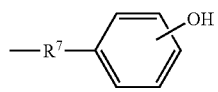
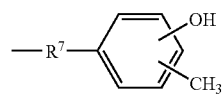

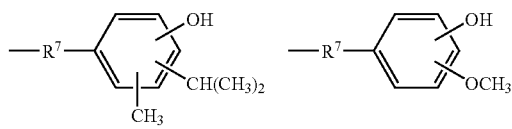

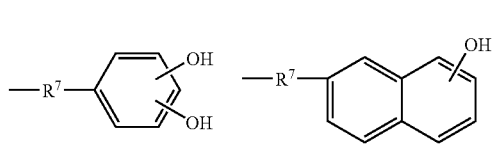

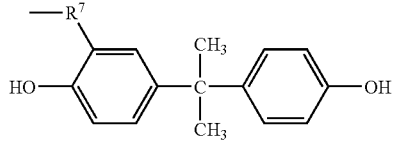

In the above formulas, "n" is an integer ranging from 0 to 1,000, preferably 0 to 100, and most preferably 0 to 20. If "n" exceeds the recommended upper limit, this will impair compounding with component (A) and industrial handleability.

Aforementioned component (B) is exemplified by organosiloxanes represented by the formulas given below, where "x" is an integer from 1 to 20, and "y" is an integer from 2 to 10.

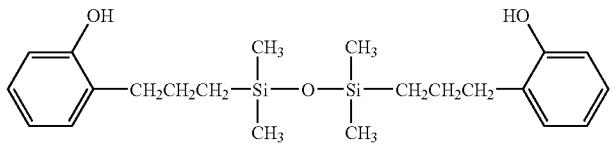

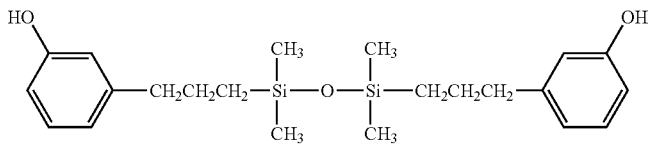

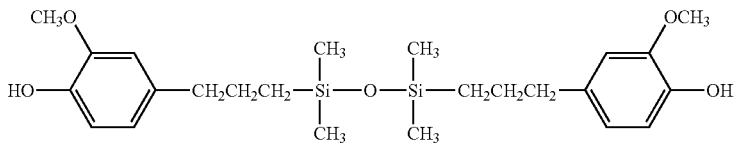

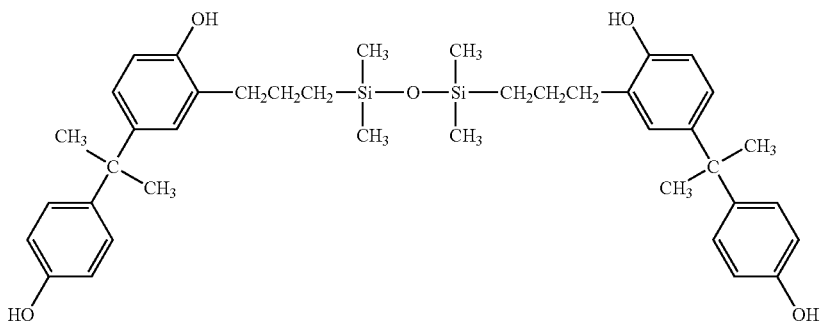

-continued

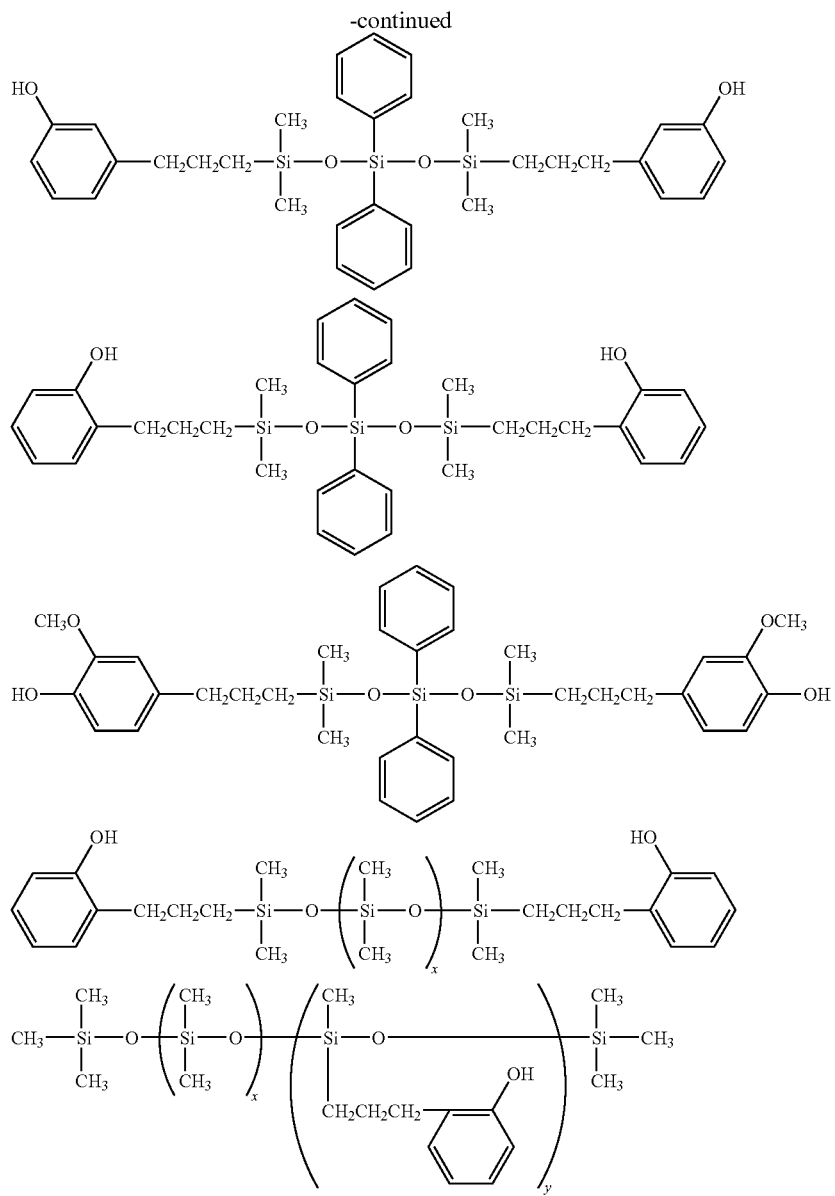

There are no special restrictions with regard to the method that can be used for manufacturing component (B). For example, this component can be obtained by subjecting an alkenyl-containing phenol compound and an organopolysiloxane that has silicon-bonded hydrogen atoms to a hydrosilylation reaction.

There are no special restrictions with regard to the form of component (B) at 25° C., and it can be in a liquid or in a solid form. The liquid form is preferred from the viewpoint of easier handling. It is recommended that the viscosity of a liquid component (B) at 25° C. be in the range of 1 to 1,000,000 mPa·s, preferably 10 to 5,000 mPa·s. If the viscosity at 25° C. is below the recommended lower limit, the obtained cured body will have reduced mechanical strength. If, on the other hand, the viscosity exceeds the recommended upper limit, this will impair industrial handleability of the composition.

There are no special restrictions with regard to amounts in which component (B) can be used in the composition, but, in general, it is recommended to use this component in an amount of 0.1 to 500 parts by mass, preferably in the range of 0.1 to 200 parts by mass per 100 parts by mass of component (A). When component (B) contains phenolic hydroxyl groups, it is recommended that the mole ratio of the phenolic hydroxyl groups contained in component (B) to all epoxy groups contained in the composition be in the range of 0.2 to 5, preferably 0.3 to 2.5, and most preferably 0.8 to 1.5. If the mole ratio of the phenolic hydroxyl groups contained in component (B) to all epoxy groups contained in the composition is below the recommended lower limit, it will be difficult to ensure complete curing of the obtained composition. If, on the other hand, the aforementioned ratio exceeds the recommended upper limit, this will impair mechanical properties of the cured body obtained from the composition.

Component (C), which is an epoxy compound, is used in the composition in order to improve bonding and to restrict bleeding of oil to the surface of the cured body. Component (C) is represented by the following general formula:

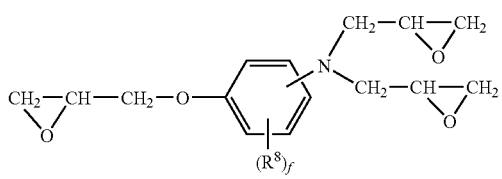

In the above formula, designates a substituted or unsubstituted monovalent hydrocarbon group having 1 to 10 carbon atoms. The aforementioned monovalent hydrocarbon group can be exemplified by methyl, ethyl, propyl, isopropyl, n-butyl, sec-butyl, t-butyl, pentyl, hexyl, octyl, decyl, or similar alkyl groups; cyclopentyl, cyclohexyl, cycloheptyl, or similar cycloalkyl groups; methoxyethyl, ethoxyethyl, or similar ethoxy-substituted alkyl groups; vinyl, allyl, butenyl, or similar alkenyl groups; cyclopentenyl, cyclohexenyl, or similar cycloalkenyl groups; phenyl, tolyl, xylyl, ethylphenyl, butylphenyl, t-butylphenyl, dimethylnaphthyl, or similar aryl groups; benzyl, phenethyl, phenylpropyl, or similar aralkyl groups; 3-chloropropyl, 3,3,3-trifluoropropyl, or similar halogenated alkyl groups; methoxyphenyl, ethoxyphenyl, butoxyphenyl, t-butoxyphenyl, methoxynaphthyl, or similar alkoxy-substituted aryl groups. Furthermore, in the above formula, "f" is an integer from 0 to 4.

The aforementioned component (C) can be obtained as a commercial product known under the trademark Epicoat 630 produced by Japan Epoxy Resin Company.

There are no special restrictions with regard to the amount in which component (C) can be used in the composition, but it may be recommended to add this component in the amount of 0.01 to 50 mass %, preferably 0.01 to 20 mass %, and most preferably 0.01 to 10 mass %. If the content of component (C) is below the recommended lower limit, it will be difficult to restrict the bleeding of oil to the surface. If, on the other hand, the content of component (C) exceeds the recommended upper limit, this will increase the modulus of elasticity in a cured body obtained from the composition.

The composition of the invention may contain a curing accelerator (D) as an arbitrary component. Such component (D) may be represented by a tertiary amine compound; aluminia, zirconia, or a similar organometallic compound; phosphine or a similar organophosphorous compound; as well as a heterocyclic amine compound, boron complex compound, organic ammonium salt, organic sulfonium salt, organic peroxide, and reaction products of the above compounds. Specific examples of such compounds are the following: triphenylphosphine, tributylphosphine, tri(p-methylphenyl) phosphine, tri(nonylphenyl) phosphine, triphenylphosphine-triphenylborate, tetraphenylphosphine-tetraphenylborate, or similar phosphorous compounds; triethylamine, benzyldimethylamine, α-methylbenzyldimethylamine, 1,8-diazabicyclo[5.4.0]undecene-7, or a similar tertiary amine; 2-methylimidazole, 2-phenylimidazole, 2-phenyl-4-methylimidazole, or a similar imidazole compound. In order to extend the pot life of the composition of the invention, the curing accelerator can be in an encapsulated form. Such an encapsulated curing-accelerating agent may comprise an encapsulated amine-type curing accelerator made from a bisphenol-A epoxy resin that contains an amine-type curing-accelerating substance. The encapsulated curing-accelerating agent can be purchased from Asahi Kasei Co., Ltd.; trademark HX-3088.

There are no special restrictions with regard to the amount in which component (D) can be added to the composition, but in general it can be recommended that this component be contained in the amount not exceeding 50 parts by mass, in particular, in the amount of 0.01 to 50 parts by mass, and most preferably, 0.1 to 5 parts by mass, per 100 parts by mass of component (A).

In order to improve mechanical strength of a cured body, the composition may contain (E) a filler. Such component (E) can be represented by the following: glass fiber, alumina fiber, ceramic fiber composed of alumina and silica, boron fiber, zirconia fiber, silicon carbide fiber, metallic fiber, or a similar fibrous filler; fused silica, crystalline silica, precipitated silica, fumed silica, baked silica, zinc oxide, baked clay, carbon black, glass beads, alumina, talc, calcium carbonate, clay, aluminum hydroxide, magnesium hydroxide, barium sulfate, aluminum nitride, boron nitride, silicon carbide, magnesia, titania, beryllium oxide, kaolin, mica, zirconia, barium sulfate, or a similar inorganic filler; powders of gold, silver, copper, aluminum, nickel, palladium, alloys and brasses of the aforementioned metals, solders, memory alloys, or other fine metal powders; gold, silver, nickel, copper, or other metal powders vapor-deposited or deposited via metallization onto the surfaces of finally powdered ceramic, glass, quartz, organic resin, etc. The above fillers can be used separately or in combinations of two or more. From the viewpoint of better thermal conductivity of the obtained cure body, the following fillers are preferable: conductive powders such as alumina, crystalline silica, aluminum nitride, boron nitride, or similar thermally conductive powders; as well as reinforcement powders made from fused silica, precipitated silica, fumed silica, colloidal silica, etc. In order to impart good thermal conductivity and electrical conductivity to cured bodies, the use of silver powder is preferable. In order impart thermally conductive properties to a cured body of the composition, it is preferable to use alumina powder. The powder particles may have the shape of ground particles, or may be spherical, fibrous, rod-like, flake-like, scale-like, plate-like, coil-like, etc. There are no special restrictions with regard to the size of the particles, but in general their maximum dimension should not exceed 200 μm, and on average should be within the range of 0.001 to 50 μm.

Also, there are no special restrictions with regard to the content of component (E), but it is recommended to add this component in an amount not exceeding 5,000 parts by mass, preferably within the range of 10 to 4,000 parts by mass, and even more preferably, within the range of 50 to 4,000 parts by mass per 100 parts by mass of component (A). When component (E) contains fillers other than the aforementioned fine metal powders or heat-conductive powdered materials, component (E) should be used in an amount not exceeding 2,000 parts by mass, preferably within the range of 10 to 2,000 parts by mass, and even more preferably, within the range of 50 to 1,000 parts by mass per 100 parts by mass of component (A). When the powder particles have a plate-like or scale-like shape, it becomes possible to reduce shrinkage during curing by using specific directivity of the particles in the obtained cured body.

In order to improve curability and workability of the composition and to improve adhesive properties of the cured body of the composition, or to adjust the modulus of elasticity, the composition can be further combined with (F) an organic epoxy compound. There are no special restrictions with regard to the form of component (F) at 25° C., and it may be liquid or solid, but the liquid form is preferable. This component can be exemplified by a bisphenol-A type of epoxy resin, a bisphenol-F type of epoxy resin, an alicyclic epoxy resin. There are no restrictions with regard to the amount in which component (F) can be added to the composition, but in general the content of this composition should not exceed 500 parts by mass, and preferably should be in the range of 0.1 to 500 parts by mass per 100 parts by mass of component (A).

In order to improve dispersity of component (E) in component (A) or to improve adhesion of the obtained cure body to semiconductor chips, substrates, or the like, the composition can be combined with a coupling agent. This coupling agent may comprise a titanate coupling agent, a silane coupling agent, or a similar coupling agent. A titanate coupling agent may comprise i-propoxytitanium tri(isostearate). A silane coupling agent may comprise 3-glycidoxypropyltrimethoxysilane, 3-glycidoxypropyl methyldiethoxysilane, 2-(3,4-epoxycyclohexyl)ethyltrimethoxysilane, or a similar epoxy-containing alkoxysilane; N-(2-aminoethyl)-3-aminopropyltrimethoxysilane, 3-aminopropyl triethoxysilane, N-phenyl-3-aminopropyltrimethoxysilane, or a similar amine-containing alkoxysilane; 3-mercaptopropyltrimethoxysilane or a similar mercapto-containing alkoxysilane; octadecyltrimethoxysilane or a similar long chain alkyl-containing silane. There are no special restrictions with regard to the amount in which the aforementioned silane coupling agent can be used, but in general it is recommended to add this agent in an amount not exceeding 10 parts by mass, preferably 0.01 to 10 parts by mass per 100 parts by mass of component (A).

Other arbitrary components of the composition may be exemplified by tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, or a similar alkoxysilane.

The composition of the invention is prepared by mixing components (A), (B), and (C), with an addition of other components if necessary. There are no special restrictions with regard to the method used for mixing the components. For example, components (A), (B), and (C) and, if necessary, arbitrary components, can be mixed simultaneously, or the aforementioned arbitrary components can be added after pre-mixing components (A), (B), and (C). Also, there are no limitations with regard to equipment that can be used for mixing. For example, this can be a single-shaft-type or a two-shaft-type continuous mixer, a two-roll mill, a three-roll mill, a Ross® mixer, a Hobart mixer, a dental mixer, a planetary mixer, a kneader mixer, or a grinding mixer.

Apart from use as a protective agent for semiconductor chips or electrical wiring, the cured bodies of the composition may be used to form insulating layers or shock-absorbing layers on semiconductor chips or printed circuit boards. There are no special restrictions with regard to the form of the cured bodies obtained from the composition, and the cured bodies may be made in the form of rubber, hard rubber, or resin, but, most preferably, with a composite modulus of elasticity not exceeding 2 GPa.

The composition of the invention can also be used for transfer molding, injection molding, potting, casting, powder coating, immersion coating, drop-wise application, etc. The method of use can be selected from potting, dispensing, screen printing, or coating; however, from the viewpoint of ease of use and decreased consumption of material, a liquid or paste form of the composition is preferable. Since the composition of the invention is suitable for forming cured bodies that are characterized by excellent flexibility and adhesion, the composition is most suitable for use as a sealing agent, casting agent, coating agent, adhesive agent, or the like, for use in conjunction with electrical devices or electronic elements.

The following is a more detailed description of an electronic component of the present invention. The electronic component of the present invention is characterized by the fact that parts thereof are sealed or bonded by using cured bodies of the composition of the invention. Such components can be exemplified by diodes, transistors, thyristors, monolithic ICs, hybrid ICs, LSIs, or VLSIs.

An example of an electronic component of the invention is shown in FIG. 1 as a cross-section of an LSI. This drawing illustrates an electronic component in which a heat-radiating element or a bonding element is made by using a curable silicone composition of the invention. The electronic component shown in FIG. 1 has a semiconductor element 1 that is installed on a substrate 2 having a wiring and is electrically connected to the substrate wiring by means of solder bumps such as a ball grid 3 provided on the semiconductor element 1. The material of the substrate may comprise a glass-reinforced epoxy resin, Bakelite resin, phenolic resin, or a similar organic resin; alumina or a similar ceramic; copper, aluminum, or a similar metal. In addition to the semiconductor element 1, the component may contain resistors, capacitors, coils, or other electronic parts. It is shown in FIG. 1 that the space between the semiconductor element 1 and the substrate 2 is filled with an underfill material, but use of such underfill material is optional.

The semiconductor device 1 is connected to a heat spreader 4 through a heat-radiating element 6. The heat spreader 4 is bonded to the substrate 2 by means of bonding elements 5. Furthermore, the heat spreader 4 is connected to a heat sink 7 through a heat-radiating element 8. The heat spreader 4 and the heat sink 7 can be made from aluminum, copper, nickel, or a similar metal. In the electronic device shown in FIG. 1, bonding elements 5 are made from cured bodies of the curable silicone composition of the present invention. Furthermore, in the electronic component in FIG. 1, the heat-radiating element 6 and/or the heat-radiating element 8 also can be made from cured bodies of the curable silicone composition of the present invention. Cured bodies of the curable silicone composition of the present invention can be used either for bonding the semiconductor element 1 to the heat-spreader 4 or for bonding the heat-spreader 4 to the substrate 2. For convenience in maintenance, the heat-radiating element 8 can be replaced by thermally conductive grease.

There are no special limitations with regard to the method of manufacturing the electronic component of the invention. For example, the structure shown in FIG. 1 can be manufactured as follows. First, the semiconductor element 1 is placed onto the substrate 2, and the semiconductor device 1 is electrically connected to the substrate 2 by means of the grid 3. Following this, if necessary, an underfiller material is used. In the next step, the surface of the semiconductor element 1 is coated with a curable silicone composition that possesses heat-conductive properties, the heat spreader 4 is attached, and the curable silicone composition is cured. As a result, the heat spreader 4 is bonded to the substrate 2 through the cured silicone composition with which the heat spreader is coated. In the next step, the curable silicone composition that possesses heat-conductive properties or heat-conductive grease is applied onto the heat spreader 4, and the heat sink 7 is attached. If the heat spreader is coated with the curable silicone composition, the latter is cured.

EXAMPLES

The curable silicone composition and the electronic component of the invention will be further described in more detail with reference to practical and comparative examples. All values of viscosities used in the examples correspond to 25° C. Mass average molecular weights are values obtained by using toluene as a solvent and were measured by gel-permeation chromatography and calculated with reference to polystyrene.

[Viscosity]

This characteristic was measured by means of an E-type viscometer (Digital Viscometer DV-U-E II-type, the product of Tokimec Company, Ltd.) at 25° C. with rotation speed of 2.5 rpm.

[Adhesive Properties]

A 50-μm-thick layer of a curable silicone composition on an alumina panel was pasted to a silicon chip having a square cross-section of 10 mm by 10 mm, and then a test piece was produced by curing the aforementioned curable silicone composition as a result of heating for 1 hour at 150° C. The obtained test piece was tested on a bond tester (Model SS-100 KP, the product of Seishin Trading Company, Ltd.) by measuring resistance to peeling (kgf/cm$^2$) at 25° C. and a peeling speed of 50 mm/min.

[Composite Modulus of Elasticity]

After deaeration, a curable silicone composition was loaded into a mold cavity having a width of 10 mm, length of 50 mm, and depth of 2 mm and was subjected to pressure-curing for 60 minutes at 150° C. under pressure of 2.5 MPa and then to secondary heating in an oven for 2 hours at 180° C., whereby a test specimen of a cured body of the composition was obtained. Composite modulus of elasticity of this test specimen was measured by means of the ARES viscoelasticity analyzer of Rheometric Scientific, Inc. Measurements were carried out at 25° C. using a strain of 0.05% and a vibration frequency of 1 Hz.

[Oil Bleeding Properties]

Curable silicone composition in the amount of 0.2 g was dropped onto the surface of a ground-glass plate, and after retention for 48 hours at 25° C., the bleed characteristic was evaluated by means of the following formula:

$$100 \times (L_1 - L_0)L_0,$$

where $L_0$ is the diameter of the curable silicone rubber, and $L_1$ is the diameter formed by the bleeding oil.

Practical Example 1

A curable silicone composition was prepared by mixing 4.38 parts by mass of an organopolysiloxane of the following average unit formula:

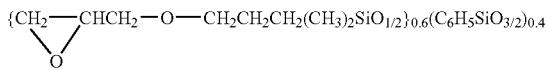

(mass average molecular weight=1,000; viscosity=1,290 mPa·s; epoxy equivalent=267); 8.46 parts by mass of an organotrisiloxane represented by the following formula:

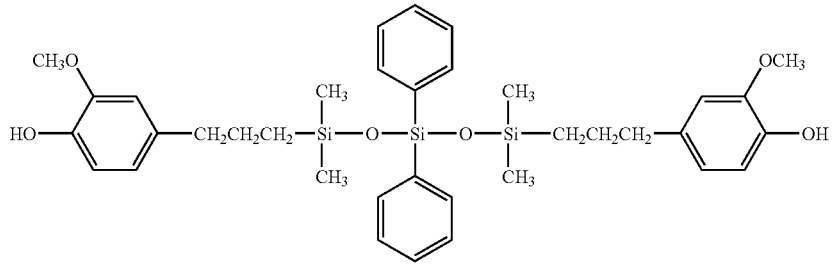

(viscosity=2,600 mPa·s; phenolic hydroxyl group equivalent=330); 0.99 part by mass of an epoxy compound represented by the following formula:

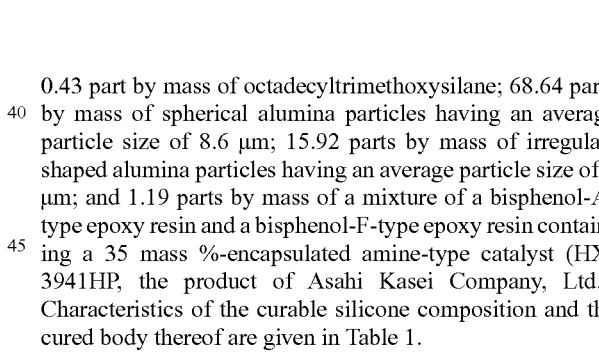

0.43 part by mass of octadecyltrimethoxysilane; 68.64 parts by mass of spherical alumina particles having an average particle size of 8.6 μm; 15.92 parts by mass of irregular-shaped alumina particles having an average particle size of 3 μm; and 1.19 parts by mass of a mixture of a bisphenol-A-type epoxy resin and a bisphenol-F-type epoxy resin containing a 35 mass %-encapsulated amine-type catalyst (HX-3941HP, the product of Asahi Kasei Company, Ltd.). Characteristics of the curable silicone composition and the cured body thereof are given in Table 1.

Comparative Example 1

A curable silicone composition was prepared by mixing 6.43 parts by mass of an organopolysiloxane of the following average unit formula:

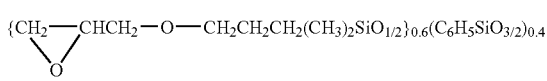

(mass average molecular weight=1,000; viscosity=1,290 mPa·s; epoxy equivalent=267); 7.57 parts by mass of an organotrisiloxane represented by the following formula:

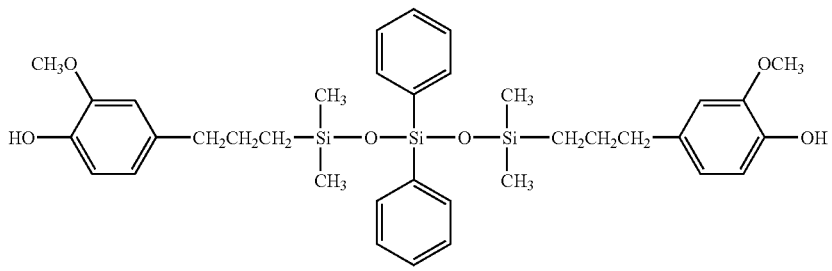

(viscosity=2,600 mPa·s; phenolic hydroxyl group equivalent=330); 0.43 part by mass of an octadecyltrimethoxysilane; 68.54 parts by mass of spherical alumina particles having an average particle size of 8.6 μm; 15.89 parts by mass of irregular-shaped alumina particles having an average particle size of 3 μm; and 1.14 parts by mass of a mixture of a bisphenol-A-type epoxy resin and a bisphenol-F-type epoxy resin containing a 35 mass %-encapsulated amine-type catalyst (HX-3941HP, the product of Asahi Kasei Company, Ltd.). Characteristics of the curable silicone composition and the cured body thereof are given in Table 1.

Practical Example 2

A curable silicone composition was prepared by mixing 8.0 parts by mass of an organopolysiloxane of the following average unit formula:

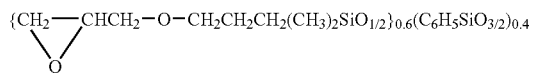

(mass average molecular weight=1,000; viscosity=1,290 mPa·s; epoxy equivalent=267); 10.7 parts by mass of an organotrisiloxane represented by the following formula:

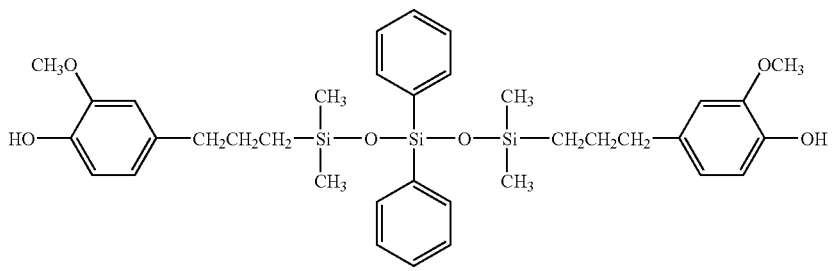

(viscosity=2,600 mPa·s; phenolic hydroxyl group equivalent=330); 0.5 parts by mass of an epoxy compound represented by the following formula:

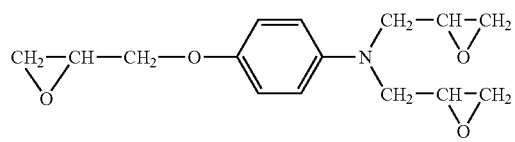

62.9 parts by mass of a spherical alumina particles having an average particle size of 8.6 μm; 17.1 parts by mass of irregular-shaped alumina particles having an average particle size of 3 μm; and 0.8 part by mass of a mixture of a bisphenol-A-type epoxy resin and a bisphenol-F-type epoxy resin containing a 35 mass %-encapsulated amine-type catalyst (HX-3941HP, the product of Asahi Kasei Company, Ltd.). Characteristics of the curable silicone composition and the cured body thereof are given in Table 1.

Comparative Example 2

A curable silicone composition was prepared by mixing 7.7 parts by mass of an organopolysiloxane of the following average unit formula:

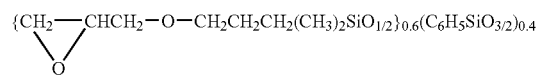

(mass average molecular weight=1,000; viscosity=1,290 mPa·s; epoxy equivalent=267); 10.7 parts by mass of an organotrisiloxane represented by the following formula:

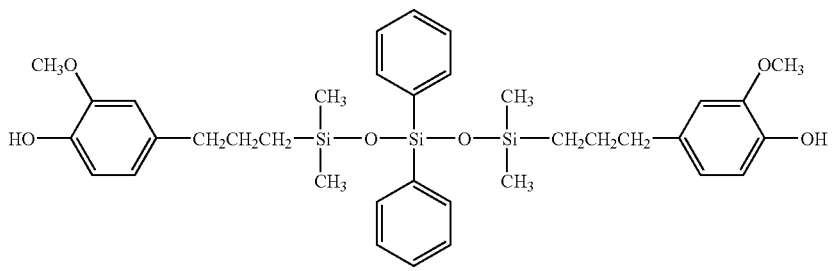

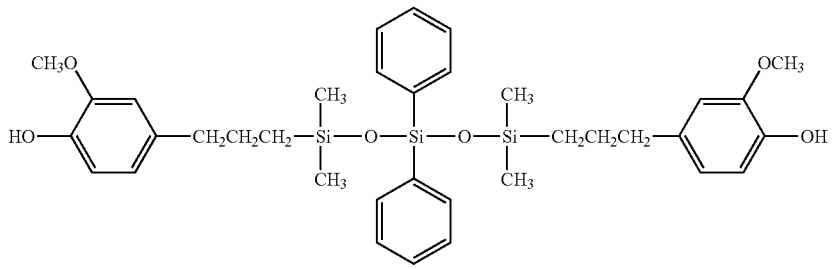

(viscosity=2,600 mPa·s; phenolic hydroxyl group equivalent=330); 1.5 parts by mass of an organotrisiloxane represented by the following formula:

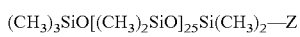

(where "Z" is a dimethylpolysiloxane represented by the following formula:

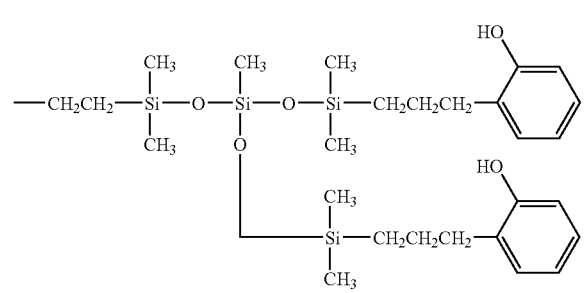

(mass average molecular weight=2,500; viscosity=75 mPa·s); 62.9 parts by mass of spherical alumina particles having an average particle size of 8.6 μm; 17.1 parts by mass of irregular-shaped alumina particles having an average particle size of 3 μm; and 0.8 parts by mass of a mixture of a bisphenol-A-type epoxy resin and a bisphenol-F-type epoxy resin containing a 35 mass %—encapsulated amine-type catalyst (HX-3941HP, the product of Asahi Kasei Company, Ltd.). Characteristics of the curable silicone composition and the cured body thereof are given in Table 1.

Practical Example 3

A curable silicone composition was prepared by mixing 6.2 parts by mass of an organopolysiloxane of the following average unit formula:

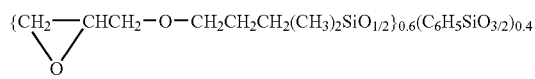

(mass average molecular weight=1,000; viscosity=1,290 mPa·s; epoxy equivalent=267); 10.5 parts by mass of an organotrisiloxane represented by the following formula:

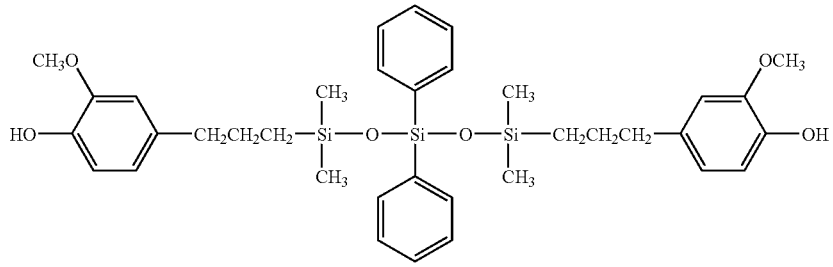

(viscosity=2,600 mPa·s; phenolic hydroxyl group equivalent=330); 2.0 parts by mass of an epoxy compound represented by the following formula:

$(CH_3)_3SiO[(CH_3)_2SiO]_{25}Si(CH_3)_2$—Z (where Z is a dimethylpolysiloxane represented by the following formula:

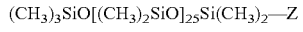

(mass average molecular weight=2,500; viscosity=75 mPa·s); 0.5 parts by mass of an epoxy compound represented by the following formula:

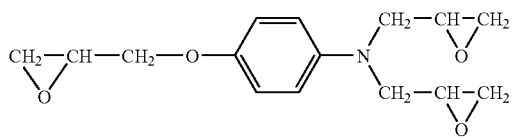

62.9 parts by mass of a spherical alumina particles having an average particle size of 8.6 μM; 17.1 parts by mass of irregular-shaped alumina particles having an average particle size of 3 μm; and 0.8 part by mass of a mixture of a bisphenol-A-type epoxy resin and a bisphenol-F-type epoxy resin containing a 35 mass %-encapsulated amine-type catalyst (HX-3941HP, the product of Asahi Kasei Company, Ltd.). Characteristics of the curable silicone composition and the cured body thereof are given in Table 1.

Practical Example 4

A curable silicone composition was prepared by mixing 3.3 parts by mass of dimethylpolysiloxane of the following average unit formula:

{where "X" is an organopolysiloxane residual radical of the following average unit formula:

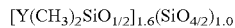

(where "Y" consists of a single bond, a trimethoxysilylpropyl group, and a 3-glycidoxypropyl group; at least one "Y" is one molecule is a single bond, and the remaining part of "Y" consists of trimethoxysilylpropyl and 3-glycidoxypropyl groups used in a mole ratio of 1 to 4)} (mass average molecular weight=51,000; viscosity=12,000 mPa·s); 6.0 parts by mass of an organopolysiloxane of the following average unit formula:

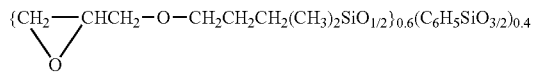

(mass-average molecular weight=1,000; viscosity=1,290 mPa·s; epoxy equivalent=267); 9.4 parts by mass of an organotrisiloxane represented by the following formula:

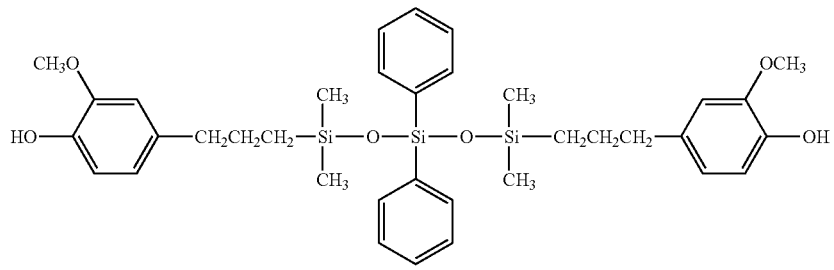

(viscosity=2,600 mPa·s; phenolic hydroxyl group equivalent=330); 0.5 part by mass of an epoxy compound represented by the following formula:

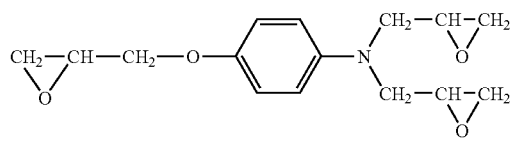

(viscosity=2,600 mPa·s; phenolic hydroxyl group equivalent=330); 62.9 parts by mass of spherical alumina particles having an average particle size of 8.6 μm; 17.1 parts by mass of irregular-shaped alumina particles having an average particle size of 3 μm; and 0.8 part by mass of a mixture of a bisphenol-A-type epoxy resin and a bisphenol-F-type epoxy resin containing a 35 mass %-encapsulated amine-type catalyst (HX-3941 HP, the product of Asahi Kasei Company, Ltd.). Characteristics of the curable silicone composition and the cured body thereof are given in Table 1.

TABLE 1

| Characteristic | Example | | | | | |
|---|---|---|---|---|---|---|
|  | Practical Examples | | | | Comparative Examples | |
|  | 1 | 2 | 3 | 4 | 1 | 2 |
| Viscosity (Pa · s) | 226 | 42 | 73 | 100 | 159 | 120 |
| Adhesion (kgf/cm²) | 80 | >100 | 95 | 87 | 53 | 68 |
| Oil Bleeding | 0.5 | 0.5 | 12 | 8 | 18 | 20 |
| Composite Modulus of Elasticity (MPa) | 510 | 1800 | 250 | 400 | 330 | 111 |

INDUSTRIAL APPLICABILITY

Since the curable silicone composition of the invention is characterized by excellent handleability, it is suitable for transfer molding, injection molding, potting, casting, powder application, application by immersion, drop-wise application, etc. Furthermore, since after curing, the composition forms a cured body that is characterized by excellent flexibility and adhesion, the composition is suitable for use as a sealing agent, casting agent, coating agent, adhesive agent, etc., in conjunction with parts of electrical and electronic devices. In particular, when the composition contains a thermally conductive filler, the composition can be used as heat-radiating materials and heat-radiating interface elements (TIM).

The invention claimed is:
1. A curable silicone composition comprising at least the following components:
(A) ($A_1$) an organopolysiloxane that contains in one molecule at least two epoxy-containing univalent organic groups and is represented by the following average unit formula:

where, $R^1$, $R^2$, and $R^3$ may be the same or different and designate monovalent hydrocarbon groups selected from alkyl groups, cycloalkyl groups, alkenyl groups, aryl groups, aralkyl groups, or halogenated alkyl groups; or epoxy-containing monovalent hydrocarbon groups; however, at least 20 mole % of the groups designated by $R^3$ are aryl groups; and where "a", "b", and "c" are numbers that satisfy the following conditions: $0 \leq a \leq 0.8$; $0 \leq b \leq 0.8$; $0.2 \leq c \leq 0.9$; $a+b+c=1$, and/or ($A_2$) a diorganopolysiloxane of the following general formula:

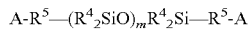

where $R^4$ is a monovalent hydrocarbon group selected from an alkyl group, a cycloalkyl group, an aryl group, or an aralkyl group, or a halogenated alkyl group; $R^5$ is bivalent organic group; and "A" is a siloxane residual radical represented by the following average unit formula:

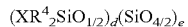

where $R^4$ is the same as defined above, and "X" is a single bond, a hydrogen atom, a group designated by $R^4$, an epoxy-containing monovalent organic group, or an alkoxysilylalkyl group; however, at least one group designated by "X" in one molecule is a single bond, at least two groups designated by "X" are epoxy-containing monovalent organic groups; "d" is a positive number; "e" is a positive number; and "d/e" is a number ranging from 0.2 to 4, and where "m" is an integer equal to or greater than 1;

(B) a curing agent for epoxy resin; and
(C) an epoxy compound represented by the following general formula:

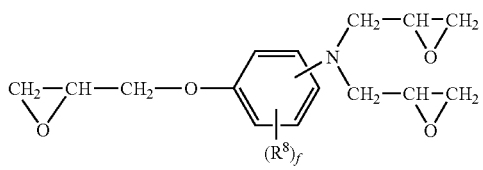

where $R^8$ is a monovalent hydrocarbon group selected from an alkyl group, a cycloalkyl group, an ethoxy-substituted alkyl group, an alkenyl group, an aryl group, an aralkyl group, a halogenated alkyl group, or alkoxy-substituted aryl group, wherein the hydrocarbon group has 1 to 10 carbon atoms; and "f" is an integer from 0 to 4.

2. The curable silicone composition of claim 1, wherein component (B) is a compound having a phenolic hydroxyl group.

3. The curable silicone composition of claim 2, wherein component (B) is an organosiloxane that contains in one molecule at least two phenolic hydroxyl groups.

4. The curable silicone composition of claim 3, wherein component (B) is an organosiloxane of the following general formula:

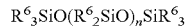

where $R^6$ is a monovalent hydrocarbon group selected from an alkyl group, a cycloalkyl group, an aryl group, an aralkyl group, or a halogenated alkyl group; or a monovalent organic group that contains a phenolic hydroxyl group; however, at least two groups in one molecule represented by $R^6$ are monovalent organic groups that contains a phenolic hydroxyl group, and "n" is an integer in the range of 0 to 1000.

5. The curable silicone composition of claim 1, wherein component (B) is contained in an amount of 0.1 to 500 parts by mass per 100 parts by mass of component (A).

6. The curable silicone composition of claim 1, wherein component (C) is contained in an amount of 0.01 to 50 mass % of the curable silicone composition.

7. The curable silicone composition of claim 1, further comprising (D) a curing accelerator.

8. The curable silicone composition of claim 7, wherein component (D) is an encapsulated amine-type curing accelerator.

9. The curable silicone composition of claim 7, wherein component (D) is contained in an amount not exceeding 50 parts by mass per 100 parts by mass of component (A).

10. The curable silicone composition of claim 1, further comprising (E) a filler.

11. The curable silicone composition of claim 10, wherein component (E) is contained in an amount not exceeding 5,000 parts by mass per 100 parts by mass of component (A).

12. The curable silicone composition of claim 10, wherein component (E) is a thermally conductive filler.

13. The curable silicone composition of claim 1, further comprising (F) an organic epoxy resin.

14. The curable silicone composition of claim 13, wherein component (F) is contained in an amount not exceeding 500 parts by mass per 100 parts by mass of component (A).

15. An electronic component sealed or bonded by means of a cured body of a curable silicone composition according to claim 1.

* * * * *